United States Patent
Hartz et al.

(10) Patent No.: US 7,615,103 B2
(45) Date of Patent: Nov. 10, 2009

(54) APPARATUS AND METHOD FOR REMOVING BUBBLES FROM A PROCESS LIQUID

(75) Inventors: Helge Hartz, Volkersdorf (DE); Markus Nopper, Dresden (DE); Axel Preusse, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 782 days.

(21) Appl. No.: 11/201,970

(22) Filed: Aug. 11, 2005

(65) Prior Publication Data

US 2006/0169579 A1 Aug. 3, 2006

(30) Foreign Application Priority Data

Jan. 31, 2005 (DE) ........................ 10 2005 004 361

(51) Int. Cl.
*B01D 19/00* (2006.01)
(52) U.S. Cl. .............................. 95/243; 95/254; 95/260; 96/204; 96/215; 96/219; 205/99
(58) Field of Classification Search .................. 95/254, 95/260, 243, 241, 262; 96/204, 215, 220, 96/219, 155; 205/99
See application file for complete search history.

(56) References Cited

U.S. PATENT DOCUMENTS

| | | | | |
|---|---|---|---|---|
| 1,055,549 | A * | 3/1913 | McIntosh | 96/215 |
| 2,235,592 | A * | 3/1941 | Schneider | 261/89 |
| 5,217,536 | A * | 6/1993 | Matsumura et al. | 118/602 |
| 5,674,199 | A * | 10/1997 | Brugger | 604/122 |
| 5,900,045 | A * | 5/1999 | Wang et al. | 95/241 |
| 6,258,220 | B1 * | 7/2001 | Dordi et al. | 204/198 |
| 6,416,632 | B1 * | 7/2002 | Kirjasniemi et al. | 162/380 |
| 7,189,146 | B2 * | 3/2007 | Basol et al. | 451/41 |
| 2002/0195334 | A1 * | 12/2002 | Hay et al. | 204/275.1 |
| 2004/0222100 | A1 * | 11/2004 | Basol | 205/99 |

FOREIGN PATENT DOCUMENTS

| | | |
|---|---|---|
| DE | 32 14 635 C2 | 4/1982 |
| DE | 38 22 093 C2 | 6/1988 |
| DE | 691 07 685 T2 | 6/1991 |
| DE | 195 40 010 A1 | 10/1995 |
| DE | 698 10 999 T2 | 6/1998 |
| DE | 103 45 379 B3 | 9/2003 |

\* cited by examiner

*Primary Examiner*—Duane Smith
*Assistant Examiner*—Douglas J Theisen
(74) *Attorney, Agent, or Firm*—Williams, Morgan & Amerson, P.C.

(57) ABSTRACT

The present invention is directed to methods and apparatuses for removing bubbles from a process liquid. The process liquid can comprise a plating solution used in a plating tool. The process liquid is supplied to a tank. A plurality of streams of the process liquid are directed towards a surface of the process liquid from below. This can be done by feeding the process liquid to a flow distributor comprising a plurality of openings providing flow communication between an inner volume of the flow distributor and a main volume of the tank. Before leaving the tank through an outlet, the process liquid flows through a flow barrier.

21 Claims, 6 Drawing Sheets

APPARATUS AND METHOD FOR REMOVING BUBBLES FROM A PROCESS LIQUID

BACKGROUND OF THE INVENTION

1. Field of the Invention

The present invention generally relates to the field of fabrication of integrated circuits, and, more particularly, to manufacturing processes involving the application of process liquids, such as plating solutions, onto the surface of a substrate.

2. Description of the Related Art

Integrated circuits comprise a large number of individual circuit elements, e.g., transistors, capacitors and resistors, formed on a substrate. These elements are connected internally by means of electrically conductive lines to form complex circuits such as memory devices, logic devices and microprocessors. In order to accommodate all the electrically conductive lines required to connect the circuit elements, in modern integrated circuits, the electrically conductive lines are arranged in a plurality of levels stacked on top of each other.

Frequently, the electrically conductive lines are formed by means of a so-called damascene process, wherein, on a semiconductor substrate, an interlayer dielectric is deposited in which vias and trenches are formed. These vias and trenches are then filled with metal, e.g., copper, to provide electrical contact between the circuit elements. To this end, a metal layer is deposited. In the following, the metal used for filling the vias and trenches will be denoted as "conductor metal."

Frequently, electroplating is used for the deposition of the conductor metal layer. Electroplating is an electrochemical process which can be performed by means of specialized plating tools.

FIG. 1 shows a schematic cross-sectional view of a plating tool 100 according to the state of the art. The plating tool 100 comprises a process chamber 101 which is adapted to receive a plating solution 102. The process chamber 101 comprises an inner compartment 115 and an outer compartment 116 which are separated by a divider 117. The divider 117 and the outer compartment 116 run circularly around the inner compartment 115. An electrode 103, which is substantially comprised of the conductor metal, is provided within the inner compartment 115. The process chamber 101 further comprises a substrate holder 104 adapted to receive a substrate 105. A contact ring 106 provides electrical contact between the substrate 105 and the substrate holder 104. The electrode 103 and the substrate holder 104 are electrically connected to a power source 109, which is connected to a control unit 110.

Additionally, the plating tool 100 comprises a plating solution tank 111. A supply line 113 is adapted to supply the plating solution 102 from the plating solution tank 111 to the inner compartment 115. A pump 114 is configured to pump the plating solution 102 through the supply line 113. The pump 114 is connected to the control unit 110. A discharge line 112 is adapted to remove the plating solution 102 from the outer compartment 116 of the process chamber 101 and to supply it to the plating solution tank 111.

In operation, the control unit 110 activates the pump 114 in order to pump the plating solution 102 from the plating solution tank 102 to the inner compartment 115 of the process chamber 101, where it is conveyed to the substrate 105. The plating solution flows over the divider 117 from the inner compartment 115 into the outer compartment 116. From the outer compartment 116, the plating solution 102 flows back into the plating solution tank 111 via the discharge line 112.

The electrode 103 and the substrate 105 are in contact with the plating solution 102. The plating solution 102 comprises ions of the conductor metal. If the conductor metal comprises copper, the plating solution may be, e.g., an aqueous solution of copper sulfate comprising $Cu^{2+}$ and $SO_4^{2-}$ ions. The control unit 110 controls the power source 109 to apply a current between the electrode 103 and the substrate holder 104. A polarity of this current, averaged over time, is such that the electrode 103 becomes an anode and the substrate 105 becomes a cathode. At the electrode 103, atoms of the conductor metal are positively ionized and change from a solid state in the electrode 103 into a dissolved state in the plating solution 102. At the substrate 105, positively charged ions of the conductor metal change from the dissolved state in the plating solution to the solid state and are deposited on the substrate 105. In the course of time, a metal layer 107 comprising the conductor metal is deposited on the surface of the substrate 105.

As a further step of the well-known damascene technique, a chemical mechanical polishing process is performed to remove excess metal deposited during the previous plating process to reliably fill the vias and trenches.

In the electroplating process described above, it is desirable to obtain a uniform thickness of the metal layer 107. The quality of the metal layer 107, however, may be adversely affected by gas bubbles in the plating solution 102. Such gas bubbles may be introduced into the plating solution by cascading flows such as the flow of the plating solution 102 over the divider 117 or tiny leaks in the tubes 112, 113 acting as Venturi vents. The bubbles may collect on the substrate 105, for example close to a center thereof, where they can impede the flow of the plating solution towards portions of the surface of the substrate 105 covered by the bubbles.

Thus, the bubbles adversely affect the transport of metal ions towards the portions of the substrate 105 covered by the bubbles. Therefore, a thickness of the deposited metal layer 107 on the portions of the substrate 105 covered by the bubbles can be significantly smaller than a thickness of the metal layer on other portions of the substrate 105. This may lead to an insufficient filling of vias and trenches. Insufficiently filled vias and trenches, in turn, may lead to malfunctions of integrated circuits formed on the substrate 105.

In view of the above problems, there is a need for an apparatus and a method allowing removal of bubbles from a process liquid. Moreover, there is a need for a plating tool wherein adverse effects of bubbles in the plating solution on the quality of a metal layer deposited by means of electroplating can be reduced.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to an illustrative embodiment of the present invention, a tank for a process liquid comprises an inlet area for receiving the process liquid and a flow distributor connected to the inlet area. The flow distributor comprises a plurality of openings providing flow communication between an inner volume of the flow distributor and a main volume of the tank. Additionally, the tank comprises a flow barrier located below the flow distributor and an outlet area located below the flow barrier.

According to another illustrative embodiment of the present invention, a plating tool comprises a process chamber adapted to receive and support a substrate. The plating tool further comprises at least one supply line adapted to convey a plating solution to the substrate, at least one discharge line adapted to remove plating solution from the process chamber and a plating solution tank. The plating solution tank comprises a flow distributor connected to the at least one discharge line. The flow distributor comprises a plurality of openings providing flow communication between an inner volume of the flow distributor and a main volume of the plating solution tank. The plating solution tank further comprises a flow barrier located below the flow distributor and an outlet area located below the flow barrier and providing flow communication between the main volume and the at least one supply line.

According to yet another illustrative embodiment of the present invention, a method of removing bubbles from a process liquid comprises supplying the process liquid to a tank. The supply of the process liquid comprises directing a plurality of flows of the process liquid towards a surface of the process liquid from below. The process liquid is flowed out of the tank. Thereby, the process liquid passes a flow barrier and flows through at least one outlet provided below the flow barrier.

BRIEF DESCRIPTION OF THE DRAWINGS

The invention may be understood by reference to the following description taken in conjunction with the accompanying drawings, in which like reference numerals identify like elements, and in which.

Figure 1:
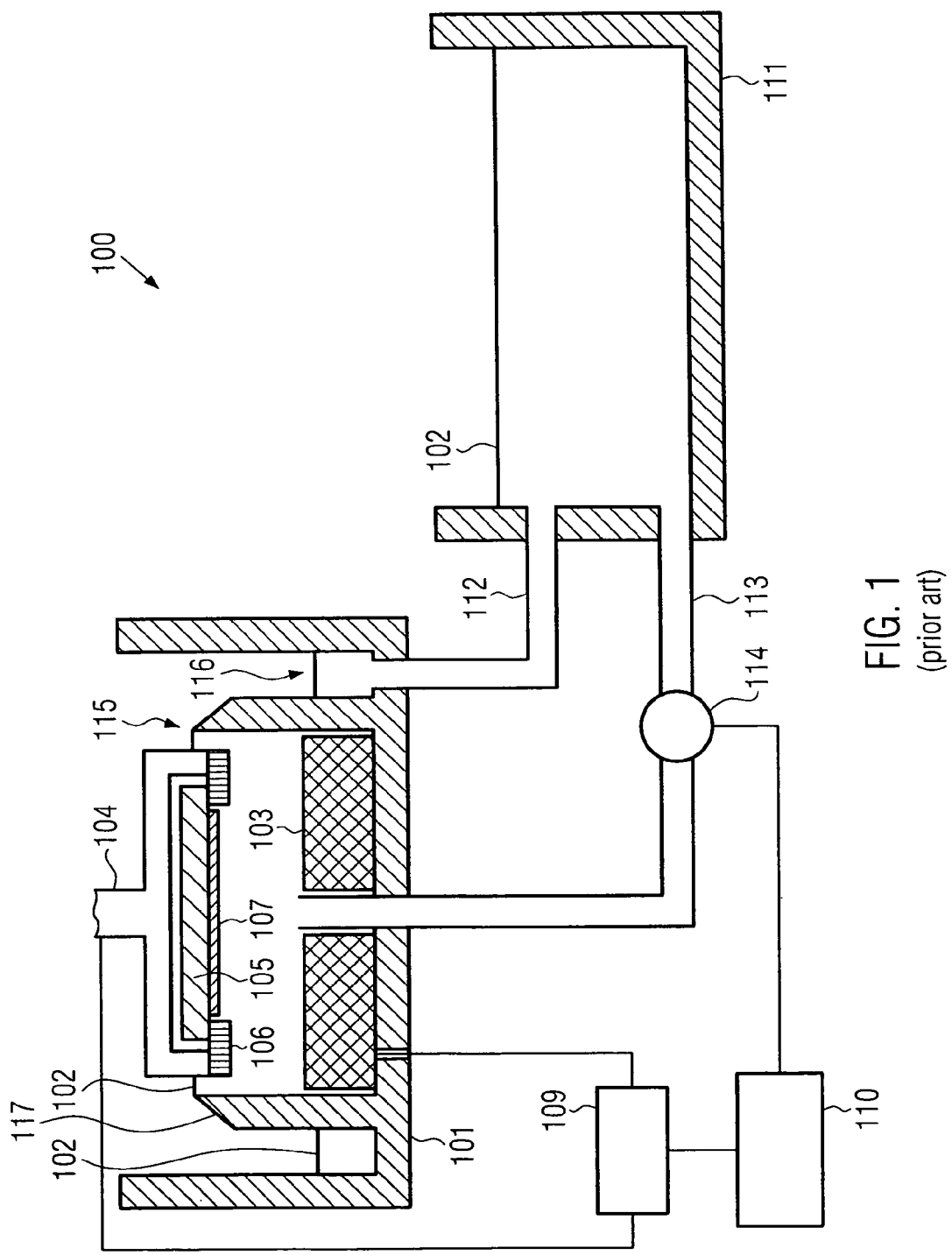
FIG. 1 shows a schematic cross-sectional view of a plating tool according to the state of the art.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is generally directed to methods and apparatuses for removing bubbles from a process liquid. The process liquid can comprise a plating solution used in a plating tool. In embodiments of the present invention, the process liquid is supplied to a tank. A plurality of flows of the process liquid are directed towards a surface of the process liquid from below. This can be done by feeding the process liquid to a flow distributor comprising a plurality of openings providing flow communication between an inner volume of the flow distributor and a main volume of the tank.

The process liquid entering the tank flows towards the surface of the process liquid. Therefore, and due to their buoyancy, bubbles in the process liquid are transported upwards to the surface of the process liquid where they burst.

Additionally, a flow barrier can be provided below the flow distributor, between the flow distributor and an outlet of the tank. The flow barrier provides a resistance to the flow of the process liquid supplied to the tank towards the outlet. Therefore, the process liquid supplied to the tank and the bubbles contained therein remain relatively close to the surface for a longer time than, e.g., in the plating solution tank 111 used in the plating tool according to the state of the art described above with reference to FIG. 1. Thus, the likelihood that bubbles float up to the surface and burst is further increased.

Figure 2A:
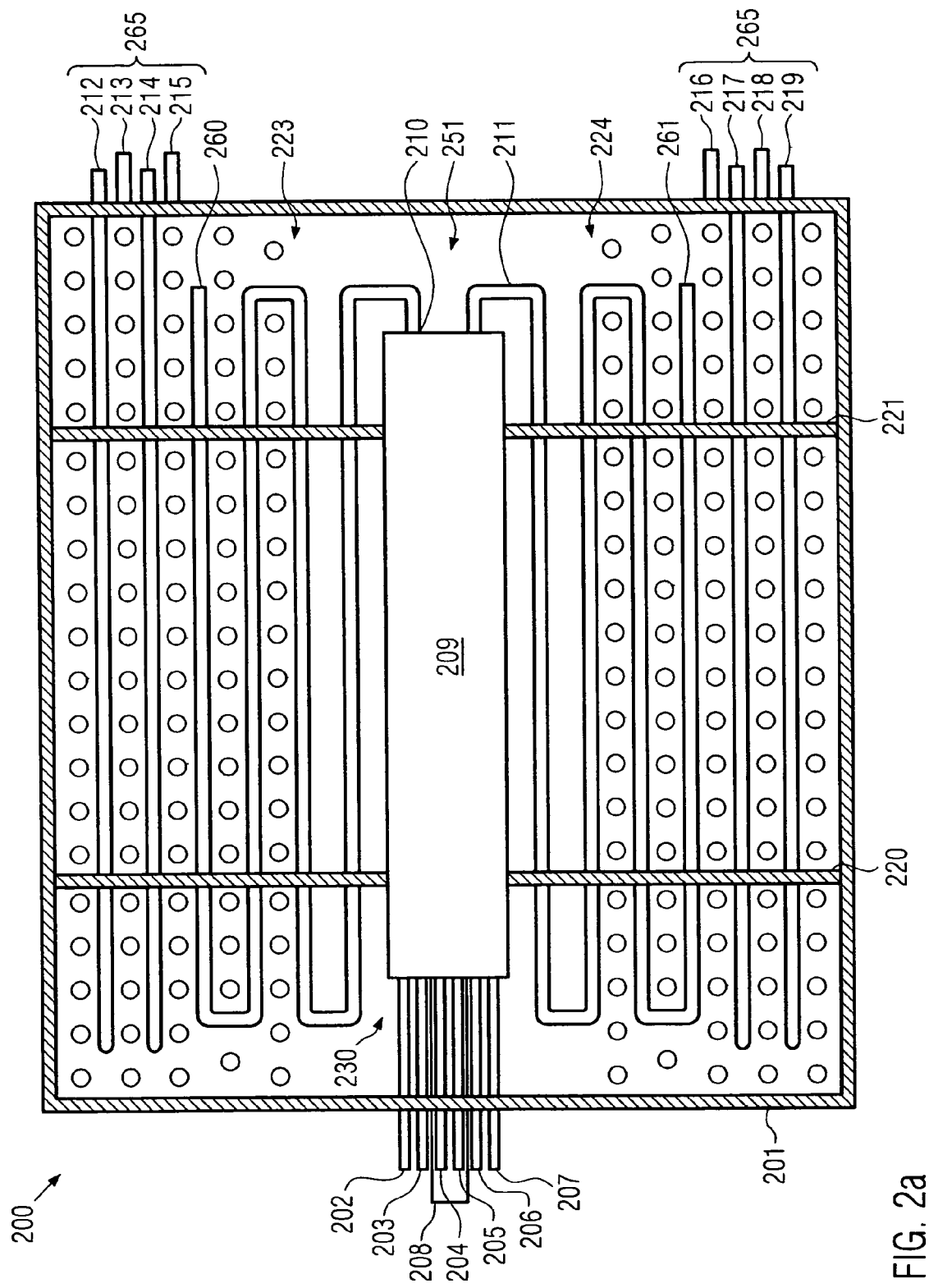
FIG. 2*a* shows a schematic top view of a tank for a process liquid according to one illustrative embodiment of the present invention.
Figure 2B:
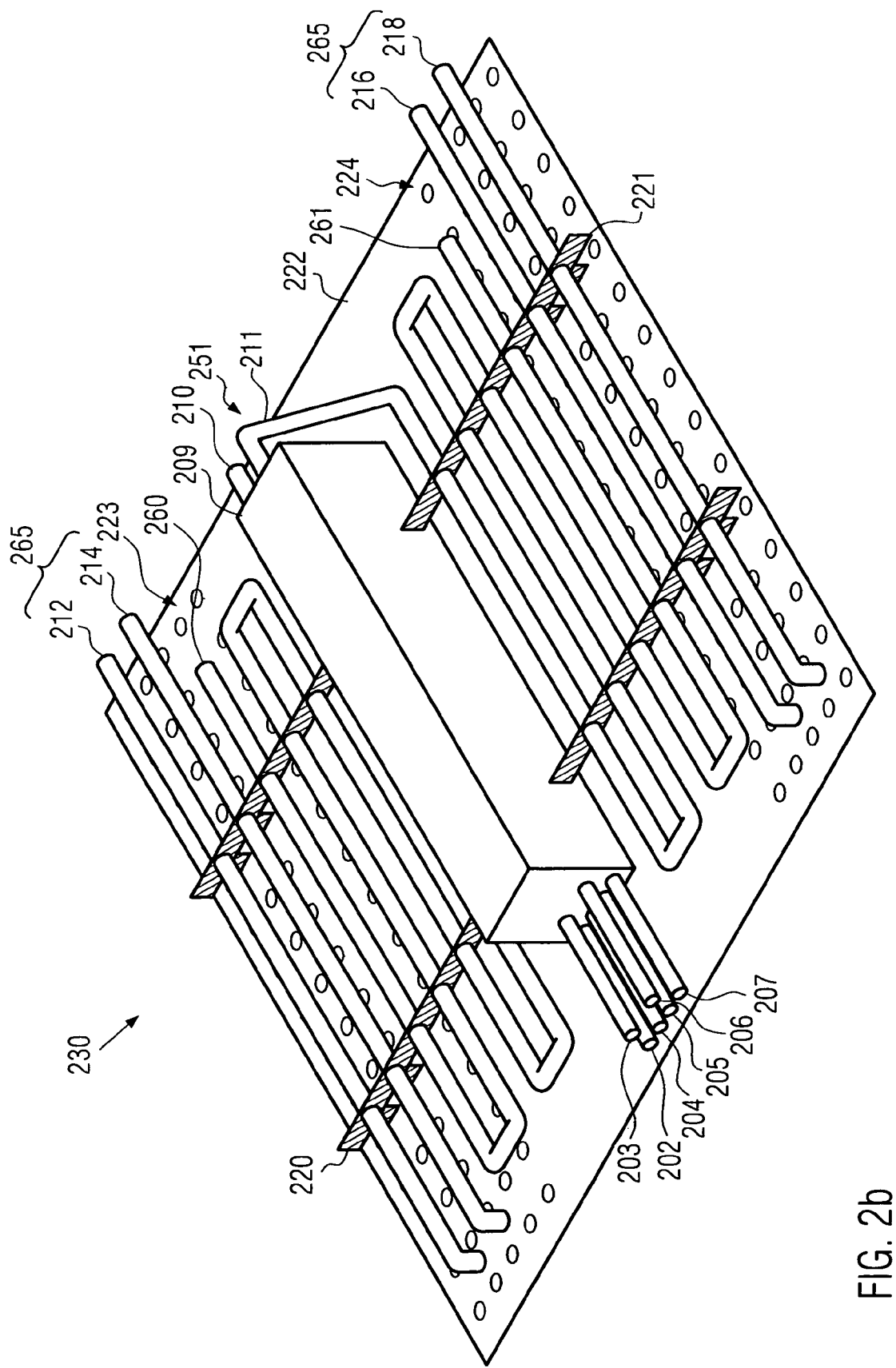
FIG. 2*b* shows a schematic perspective view of a bubble removal system in the tank for a process liquid shown in FIG. 2*a*.
Figure 2C:
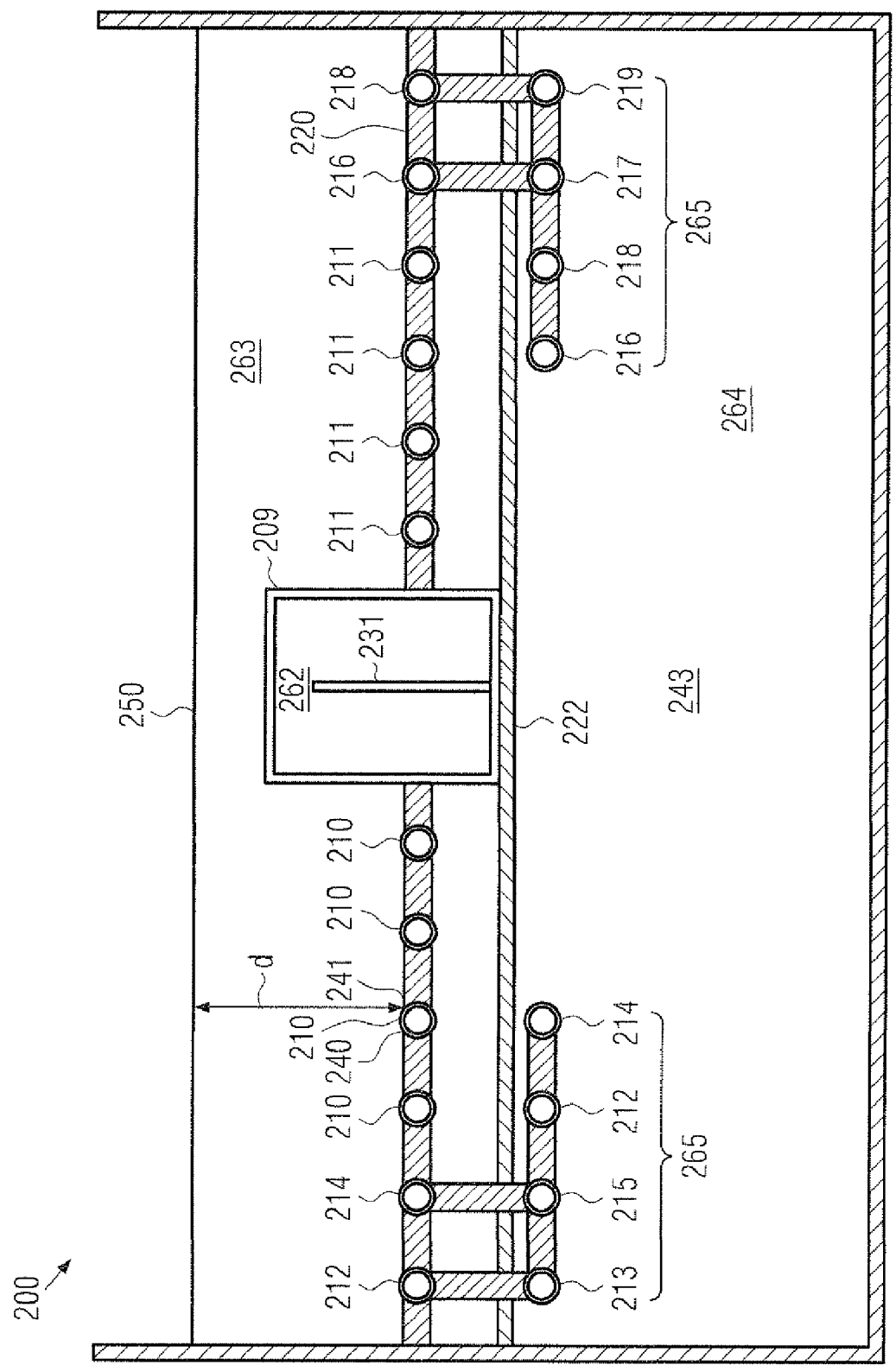
FIG. 2*c* shows a schematic cross-sectional view of the tank for a process liquid shown in FIG. 2*a*.
Figure 2D:
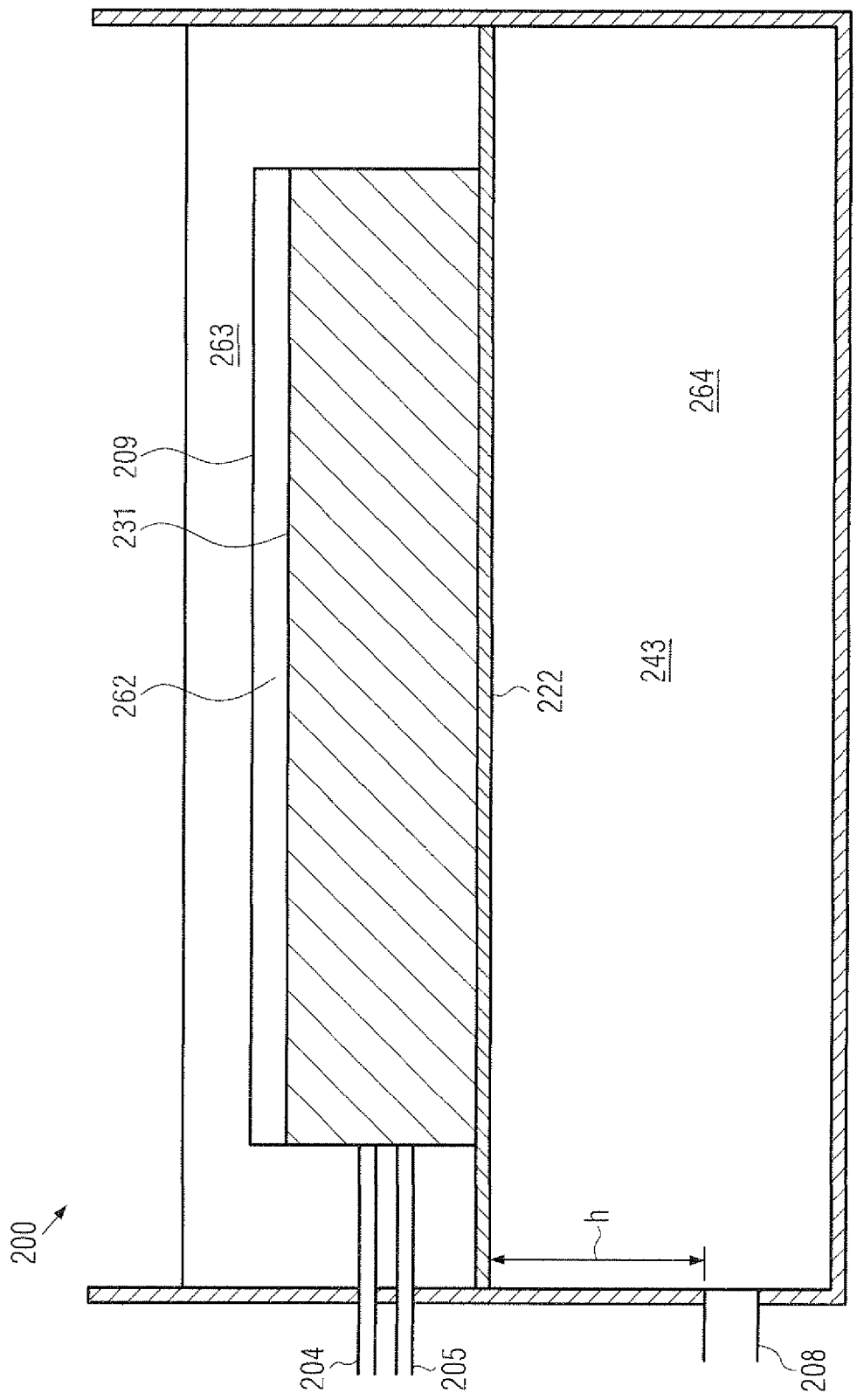
FIG. 2*d* shows another schematic cross-sectional view of the tank for a process liquid shown in FIG. 2*a*.

Further embodiments of the present invention will now be described with reference to FIGS. 2*a*-2*f*. FIG. 2*a* shows a schematic top view of a tank 200 for a process liquid according to one illustrative embodiment of the present invention. The tank 200 comprises a bubble removal system 230, a schematic perspective view of which is shown in FIG. 2*b*. FIGS. 2*c* and 2*d* show schematic cross-sectional views of the tank 200.

The tank 200 comprises a plurality of inlets 202-207 and an outlet 208. The inlets 202-207 are adapted to receive a process liquid. The outlet 208 is provided below the inlets 202-207 and is adapted to discharge the process liquid from the tank 200. In other embodiments of the present invention, the tank 200 may comprise only one inlet instead of the plurality of inlets 202-207 and/or can comprise more than one outlet.

The inlets 202-207 are connected to an accumulator 209. The accumulator 209 can have the shape of a box comprising a plurality of walls separating an inner volume of the accumulator 209 from a main volume 243 of the tank 200. In the accumulator 209, the process liquid supplied to the inlets 202-207 is collected. A separation wall 231 separates a left portion and a right portion of an inner volume 262 of the accumulator 209 from each other. The separation wall 231, however, does not extend up to a top wall of the accumulator 209. Hence, the left and the right portions of the inner volume 262 of the accumulator 209 are in flow communication with each other. The inlets 202-207 and the accumulator 209 together form an inlet area of the tank 200.

The accumulator 209 provides flow communication between the inlets 202-207 and a flow distributor 251. The flow distributor 251 comprises a first tube 210 and a second tube 211 connected to a portion of the accumulator 209 distal to the inlets 202-207. At least a portion of each of the tubes 210, 211 is substantially horizontal. The tubes 210, 211 comprise a plurality of bends and a plurality of substantially straight portions and meander back and forth along sidewalls of the accumulator 209.

Figure 2E:
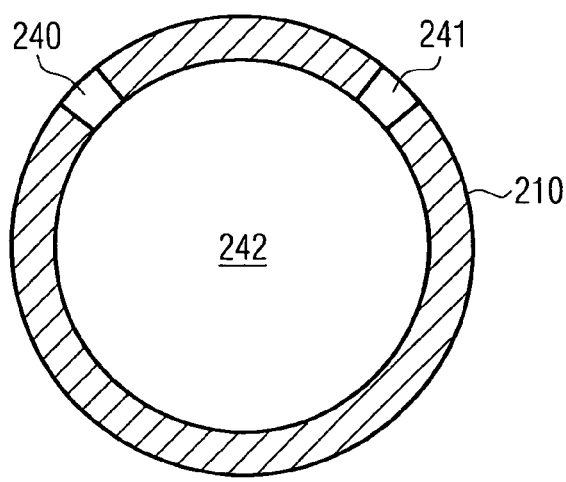
FIG. 2*e* shows a schematic cross-sectional view of a tube in a flow distributor in the tank for a process liquid shown in FIG. 2*a*.

A schematic cross-sectional view of the tube 210 is shown in FIG. 2e. The tube 210 comprises a plurality of openings 240, 241 provided in an upper part of the substantially horizontal portion thereof. In embodiments of the present invention, the upper part comprises an upper half, an upper third or an upper quarter of the diameter of the tube 210. The openings 240, 241 provide flow communication between an inner volume 242 (see FIG. 2e) of the tube 210 and the upper portion 263 (see FIG. 2c) of the main volume 243 of the tank 201. Openings in the upper part of the tube 210 similar to the openings 241 can be provided over the complete length of the substantially horizontal portion of the tube 210, or over a part of the length thereof. An end 260 of the first tube 210 distal to the accumulator 209 is closed.

The second tube 211 of the flow distributor 251 can have a configuration similar to that of the first tube 210. The second tube 211 may comprise openings provided in an upper part of a substantially horizontal portion thereof. These openings can be provided over the complete length of a substantially horizontal portion of the tube 211. An end 261 of the second tube 211 can be closed.

The bubble removal system in a tank for a process liquid according to the present invention need not comprise an accumulator. In other embodiments of the present invention, the inlets 202-207 can be directly connected to the tubes 210, 211 of the flow distributor 251.

The flow distributor 251 need not comprise two tubes. In other embodiments of the present invention, the flow distributor 251 may comprise only one tube, or three or more tubes, instead of the tubes 210, 211 described above. The tubes need not meander back and forth. Instead, in other embodiments of the present invention, the tubes can be substantially straight or may be wound in a spiral shape.

Under the flow distributor 251, a flow barrier 222 is provided. The flow barrier 222 separates an upper portion 263 and a lower portion 264 of a main volume 243 of the tank 200 from each other.

The flow barrier 222 can be arranged substantially horizontally and may comprise a plate of a material being substantially impermeable to the process liquid and having a plurality of openings 223, 224 providing flow communication between the upper portion 263 and the lower portion 264 of the main volume 243. The size, shape, number and location of the openings 223, 224 may vary depending upon the particular application.

Figure 2F:
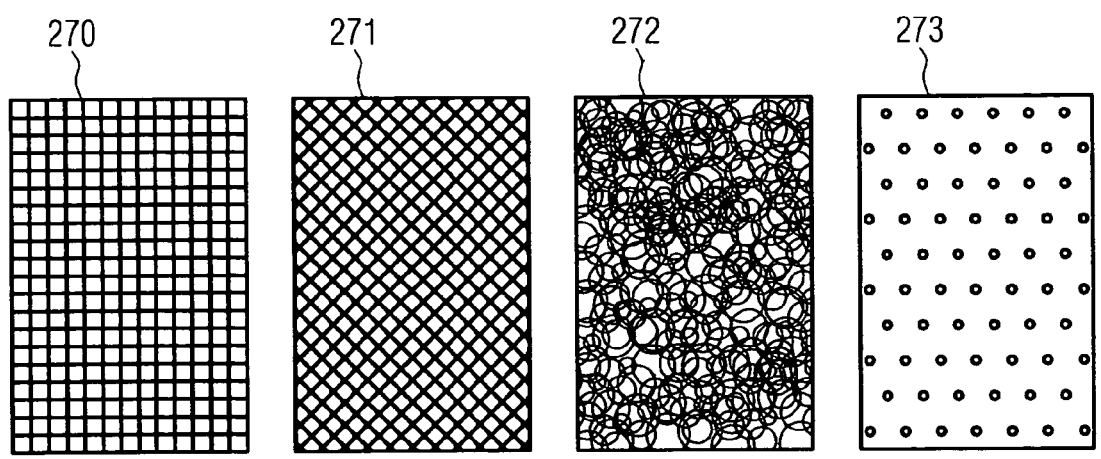
FIG. 2*f* shows schematic views of sections of flow barriers in bubble removal systems according to various illustrative embodiments of the present invention.

FIG. 2f shows schematic views of sections of the flow barrier 222 in other illustrative embodiments of the present invention. The flow barrier 222 can comprise a mesh of wires 270, a web 271, a filter fabric 272, a porous material 273 or any other component providing resistance to liquid flow, yet being permeable for the process liquid.

A distance h (FIG. 2d) between the outlet 208 and the flow distributor 251 and/or the flow barrier 222 can be about 60 cm or more. Advantageously, a moderately large distance h between the bubble removal system 230 and the outlet 208 leads to a more even flow of the process liquid through the tank 200.

Additionally, the tank 200 can comprises a temperature controller 265 comprising cooling coils 212, 213, 218, 219 and heating coils 214, 215, 216, 217. The temperature controller 265 may further comprise a temperature sensor (not shown) adapted to measure a temperature of the process liquid 250.

In other embodiments of the present invention, the heating coils 214, 215, 216, 217 and the cooling coils 212, 213, 218, 219 may be replaced by a temperature controller comprising at least one of an electric heating and a Peltier cooler. In further embodiments, the tank 200 may comprise no temperature controller at all.

Support members 220, 221 can be provided in order to keep the tubes 210, 211 of the flow distributor, the cooling coils 212, 213, 218, 219 and the heating coils 214, 215, 216, 217 in place.

In the operation of the tank 200, the tank 200 is filled with the process liquid 250. The process liquid 250 can be, in one particular embodiment, a plating solution adapted for use in the plating of semiconductor substrates. An amount of the process liquid 250 can be controlled such that at least the openings 240, 241 of the tubes 210, 211 and the flow barrier 222 are below the surface of the process liquid 250. In some embodiments of the present invention, the whole bubble removal system 230 is below the surface of the process liquid 250. Control of the amount of process liquid 250 can be effected by adding process liquid to the tank 200 or removing process liquid from the tank 200.

The process liquid is supplied to the inlets 202-207. The process liquid then flows into the inner volume 262 of the accumulator 209. In the accumulator 209, a mixing of the process liquid flows supplied from the individual inlets 202-207 occurs. The process liquid then flows from the accumulator 209 into the first tube 210 and the second tube 211 of the flow distributor 251. Due to the mixing of flows in the accumulator 209, differences in temperature, composition and/or flow speed of the process liquid flows supplied to the inlets 202-207 are balanced out, and substantially homogeneous process liquid is supplied to the tubes 210, 211. The separation wall 231 helps guide the process liquid flows to the tubes 210, 211.

Subsequently, the process liquid flows through the tubes 210, 211 and finally leaves the tubes 210, 211 through the openings 240, 241 of the tubes 210, 211. One process liquid stream pours out of each of the openings 240, 241 into the upper portion 263 of the main volume 243 of the tank 200. Since the openings 240, 241 are provided in the upper parts of substantially horizontal portions of the tubes 210, 211, the process liquid streams are directed upwards towards the surface of the process liquid 250. Due to the upward motion of the process liquid, bubbles in the process liquid efficiently move towards the surface. Additionally, a buoyant force acts on the bubbles. The buoyant force further helps transport the bubbles towards the surface of the process liquid.

Once the bubbles reach the surface of the process liquid 250, they burst and thus are removed from the process liquid.

The individual openings 240, 241 of the tubes 210, 211 can have different sizes. In some embodiments of the present invention, a diameter of the openings 240, 241 increases towards the ends 260, 261 of the tubes 210, 211. Due to the flow of the process liquid out of the tubes 210, 211, and due to the resistance of the tubes 210, 211 with respect to liquid flow, a pressure difference between the inner volume 242 of the flow distributor 251 and the upper part 263 of the main volume 243 decreases towards the ends 260, 261 of the tubes 210, 211. Since the rate at which the process liquid pours out of an opening increases with the size of the opening and the pressure difference between the inner volume 242 and the upper part 263 of the main volume 243, an increasing diameter of the openings 240, 241 may advantageously allow maintaining substantially equal flow rates of the process liquid streams pouring out of each of the openings. In other embodiments of the present invention, the openings 240, 241 of the tubes 210, 211 can have about the same size.

Advantageously, due to the resistance of the tubes 210, 211 and the openings 240, 241 provided therein with respect to liquid flow, the flow distributor 251 may act as a pressure reducer which helps avoid high flow speeds of the process liquid which might lead to a creation of bubbles.

A distance d between the openings 240, 241 of the tubes 210, 211 and the surface of the process liquid can be relatively low. A relatively low distance d between the openings 240, 241 and the surface increases the likelihood that the bubbles quickly reach the surface and burst. In some embodiments of the present invention, the distance d can be maintained in a range from about 5-30 cm.

In embodiments of the present invention wherein the temperature controller 265 comprises cooling coils 212, 213, 218, 219 and heating coils 214, 215, 216, 217, a temperature of the process liquid in the main volume 243 of the tank 200 can be controlled by means of the cooling coils 212, 213, 218, 219 and the heating coils 214, 215, 216, 217. The temperature of the process liquid may be increased by flowing a fluid having a temperature greater than that of the process liquid through the heating coils 214, 215, 216, 217. A reduction of the temperature of the process liquid can be effected by flowing a fluid having a temperature lower than that of the process liquid through the cooling coils 212, 213, 218, 219. The flow of fluids through the heating coils 214, 215, 216, 217 and the cooling coils 212, 213, 218, 219 can be controlled in accordance with an output signal of a temperature sensor, as is well known to persons skilled in the art.

In other embodiments, temperature control of the process liquid 250 can be effected by operating respective heating devices and cooling devices such as the electric heating and the Peltier cooler described above in accordance with the output of the temperature sensor.

The process liquid 250 is flowed out of the tank 200 via the outlet 208. This can be done by pumping the process liquid out of the tank 200 by means of a pump provided in a discharge line connected to the outlet 208, similar to the pump 114 used in the plating tool according to the state of the art described above with reference to FIG. 1.

Before flowing out of the tank 200, the process liquid supplied to the inlets 202-207 passes the flow barrier 222. The flow barrier 222 provides a resistance to the flow of the process liquid from the inlets 202-207 to the outlet 208. This leads to a reduction of the flow speed of the process liquid. Therefore, the time the process liquid stays in the upper part 263 of the main volume 243 of the tank 200 is increased. This increases the likelihood that bubbles present in the process liquid supplied to the inlets 202-207 float to the surface of the process liquid 250 and are removed from the process liquid 250. In some embodiments of the present invention, the flow barrier 222 may additionally be adapted to prevent bubbles from passing the flow barrier 222.

Due to the surface tension of the process liquid, bubbles tend to adopt an approximately spherical shape. A deformation of an approximately spherical bubble or a splitting of a bubble into two or more smaller bubbles requires energy. Since a bubble would have to deform or split up in order to pass an opening smaller than its diameter, small openings provide an obstacle to the motion of bubbles.

In embodiments of the present invention wherein the flow barrier 222 comprises a substantially horizontal plate having a plurality of openings 223, 224, the openings 223, 224 may have a size smaller than a typical diameter of bubbles in the process liquid supplied to the inlets 202-207. Thus, a passing of bubbles through the flow barrier 222 can be substantially avoided. The openings 223, 224 can have a diameter of about 2 cm or less.

In other embodiments of the present invention wherein the flow barrier 222 comprises another component, such as a mesh of wires 270, a web 271, a filter fabric 272, or a porous material 273, passages for the process liquid in the component may have a diameter smaller than a typical diameter of bubbles in the process liquid 250 in order to hinder a transport of bubbles through the passages. The passages can have a diameter of about 2 mm or less.

In some embodiments of the present invention, the tank 200 is provided as a plating solution tank in a plating tool and connected to one or more process chambers thereof. In such embodiments, the process liquid 250 comprises a plating solution. Each of the one or more process chambers may have a configuration similar to that of the process chamber 101 in the plating tool 100 according to the state of the art described above with reference to FIG. 1.

The outer compartment of each of the process chambers can be connected to one of the inlets 202-207 of the tank 200 via a discharge line similar to the discharge line 112. Supply lines similar to the supply line 113 connect the outlet of the tank 200 to the inner compartments of the process chambers. Hence, the supply lines are adapted to convey the plating solution to substrates provided in the inner compartments. Pumps may be provided in the supply lines and/or the discharge lines in order to effect a transport of the plating solution from the tank 200 to the process chambers and back.

In the operation of the plating tool, the tank is operated as described above. Thus, the bubble removal system 230 removes bubbles from the plating solution. Hence, the likelihood that bubbles collect on a wafer processed in the plating tool is significantly reduced. Therefore, adverse effects of bubbles on the quality of a metal layer deposited on the wafer such as an insufficient filling of vias and trenches can advantageously be avoided.

The present invention, however, is not restricted to the removal of bubbles from a plating solution used in a plating tool. Instead, a tank for a process liquid according to the present invention can be used whenever it is desirable to remove gas bubbles from a process liquid.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of removing bubbles from a process liquid, comprising:
supplying said process liquid to a tank, said supply of said process liquid comprising directing a plurality of flows of said process liquid towards a surface of said process liquid from below, wherein supplying said process liquid comprises feeding said process liquid to a flow distributor comprising a plurality of openings providing flow communication between an inner volume of said flow distributor and a main volume of said tank; and
flowing said process liquid out of said tank, wherein said process liquid passes a flow barrier and flows through at least one outlet provided below said flow barrier.

2. The method of claim 1, wherein flowing said process liquid out of said tank comprises pumping said process liquid.

3. The method of claim 1, wherein said flow barrier is located below said flow distributor.

4. The method of claim 1, further comprising providing said flow distributor below a surface of said process liquid.

5. The method of claim 4, wherein a distance between said flow distributor and said surface of said process liquid is maintained in a range from about 5-30 cm.

6. The method of claim 1, further comprising collecting said process liquid in an accumulator providing flow communication between an inlet area of said tank and said flow distributor.

7. The method of claim 1, wherein said process liquid is supplied from a process chamber of a plating tool.

8. The method of claim 1, wherein said process liquid pumped out of said main volume is supplied to a process chamber of a plating tool.

9. A method of removing bubbles from a process liquid, comprising:
supplying said process liquid to a tank, said supply of said process liquid comprising directing a plurality of flows of said process liquid towards a surface of said process liquid from below; and
flowing said process liquid out of said tank, wherein said process liquid passes a flow barrier and flows through at least one outlet provided below said flow barrier, wherein flowing said process liquid out of said tank comprises pumping said process liquid.

10. The method of claim 9, wherein said process liquid is supplied from a process chamber of a plating tool.

11. The method of claim 9, wherein said process liquid pumped out of said tank is supplied to a process chamber of a plating tool.

12. A method of removing bubbles from a process liquid, comprising:
supplying said process liquid to a tank, said supply of said process liquid comprising directing a plurality of flows of said process liquid towards a surface of said process liquid from below, wherein said process liquid is supplied from a process chamber of a plating tool; and
flowing said process liquid out of said tank, wherein said process liquid passes a flow barrier and flows through at least one outlet provided below said flow barrier.

13. A method of removing bubbles from a process liquid, comprising:
supplying said process liquid to a tank, said supply of said process liquid comprising directing a plurality of flows of said process liquid towards a surface of said process liquid from below; and
pumping said process liquid out of a main volume of said tank, wherein said process liquid passes a flow baffler and flows through at least one outlet provided below said flow barrier and wherein said process liquid pumped out of said main volume is supplied to a process chamber of a plating tool.

14. The method of claim 1, wherein said process liquid passes through said flow barrier and flows through said at least one outlet.

15. The method of claim 14, wherein said process liquid passes through a plurality of openings in said flow barrier.

16. The method of claim 9, wherein said process liquid passes through said flow barrier and flows through said at least one outlet.

17. The method of claim 16, wherein said process liquid passes through a plurality of openings in said flow barrier.

18. The method of claim 12, wherein said process liquid passes through said flow barrier and flows through said at least one outlet.

19. The method of claim 18, wherein said process liquid passes through a plurality of openings in said flow barrier.

20. The method of claim 13, wherein said process liquid passes through said flow barrier and flows through said at least one outlet.

21. The method of claim 20, wherein said process liquid passes through a plurality of openings in said flow barrier.

* * * * *

UNITED STATES PATENT AND TRADEMARK OFFICE
CERTIFICATE OF CORRECTION

| | |
|---|---|
| PATENT NO. | : 7,615,103 B2 |
| APPLICATION NO. | : 11/201970 |
| DATED | : November 10, 2009 |
| INVENTOR(S) | : Helge Hartz, Markus Nopper and Axel Preusse |

It is certified that error appears in the above-identified patent and that said Letters Patent is hereby corrected as shown below:

Col. 10, line 23 (claim 13, line 8), delete "baffler" and insert therefor -- barrier --.

Signed and Sealed this

Eighth Day of December, 2009

David J. Kappos
*Director of the United States Patent and Trademark Office*